United States Patent
Ando et al.

(10) Patent No.: US 10,529,798 B2
(45) Date of Patent: *Jan. 7, 2020

(54) MULTIPLE WORK FUNCTION DEVICE USING GEOX/TIN CAP ON WORK FUNCTION SETTING METAL

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/117,754

(22) Filed: Aug. 30, 2018

(65) Prior Publication Data

US 2018/0374917 A1 Dec. 27, 2018

Related U.S. Application Data

(63) Continuation of application No. 15/788,421, filed on Oct. 19, 2017, now Pat. No. 10,134,833, which is a
(Continued)

(51) Int. Cl.
*H01L 21/28* (2006.01)
*H01L 29/06* (2006.01)
*H01L 21/324* (2006.01)
*H01L 21/8238* (2006.01)
(Continued)

(52) U.S. Cl.
CPC .... *H01L 29/0607* (2013.01); *H01L 21/28088* (2013.01); *H01L 21/3105* (2013.01);
(Continued)

(58) Field of Classification Search
CPC ......... H01L 21/28176; H01L 21/28008; H01L 21/82345
See application file for complete search history.

(56) References Cited

U.S. PATENT DOCUMENTS 7,381,691 B2    6/2008 Adams et al.
7,863,126 B2    1/2011 Park et al.
(Continued)

OTHER PUBLICATIONS

Demkov et al., "CMOS Gate-Stack Scaling—Materials, Interfaces and Reliability Implications", Materials Research Society Symposium Proceedings. vol. 1155. Apr. 14-16, 2009. pp. 1-6.
(Continued)

*Primary Examiner* — George R Fourson, III
(74) *Attorney, Agent, or Firm* — Tutunjian & Bitetto, P.C.; Vazken Alexanian

(57) ABSTRACT

A method is presented for tuning work functions of transistors. The method includes forming a work function stack over a semiconductor substrate, depositing a germanium oxide layer and a barrier layer over the work function stack, and annealing the germanium oxide layer to desorb oxygen therefrom to trigger oxidation of at least one conducting layer of the work function stack. The work function stack includes three layers, that is, a first layer being a TiN layer, a second layer being a titanium aluminum carbon (TiAlC) layer, and a third layer being a second TiN layer.

20 Claims, 3 Drawing Sheets

Related U.S. Application Data continuation of application No. 15/440,246, filed on Feb. 23, 2017, now Pat. No. 9,825,122.

(51) Int. Cl.
    *H01L 21/8234*      (2006.01)
    *H01L 29/49*      (2006.01)
    *H01L 21/321*      (2006.01)
    *H01L 27/088*      (2006.01)
    *H01L 21/3105*      (2006.01)
    *H01L 27/092*      (2006.01)
    *H01L 29/51*      (2006.01)

(52) U.S. Cl.
    CPC .......... *H01L 21/321* (2013.01); *H01L 21/324* (2013.01); *H01L 21/82345* (2013.01); *H01L 21/823878* (2013.01); *H01L 27/088* (2013.01); *H01L 27/092* (2013.01); *H01L 29/4966* (2013.01); *H01L 21/28008* (2013.01); *H01L 21/28176* (2013.01); *H01L 29/517* (2013.01)

(56) References Cited

U.S. PATENT DOCUMENTS

| | | |
|---|---|---|
| 8,778,754 B2 | 7/2014 | Lin |
| 8,836,049 B2 | 9/2014 | Tsai et al. |
| 2010/0109095 A1 | 5/2010 | Li et al. |
| 2012/0037999 A1 | 2/2012 | Jagannathan et al. |
| 2014/0004692 A1 | 1/2014 | Wei et al. |
| 2014/0239407 A1 | 8/2014 | Manabe et al. |
| 2015/0179640 A1 | 6/2015 | Kim et al. |
| 2016/0307805 A1 | 10/2016 | Lai et al. |

OTHER PUBLICATIONS

Lin et al., "High Performance 14nn SOI FinFET CMOS Technology with 0.0174 µm2 embedded DRAM and 15 Levels of Cu Metallization", 2014 IEEE International Electron Devices Meeting. Dec. 15-17, 2014. pp. 1-3.

List of IBM Patents or Patent Applications Treated as Related dated Aug. 30, 2018, 2 pages.

MULTIPLE WORK FUNCTION DEVICE USING GEOX/TIN CAP ON WORK FUNCTION SETTING METAL

BACKGROUND

Technical Field

The present invention relates generally to semiconductor devices, and more specifically, to multiple work function devices using a germanium oxide/titanium nitride (GeOx/TiN) cap on a work function setting metal.

Description of the Related Art

There is great difficulty in maintaining performance improvements in devices of deep submicron generations. Thus, methods for improving performance without scaling down dimensions have become of interest. There is a promising avenue toward higher gate capacitance without having to make the gate dielectric thinner. This approach involves the use of high-k materials. The dielectric constant of such materials is higher than that of silicon dioxide ($SiO_2$). A high-k material can physically be thicker than an oxide and still have a lower equivalent oxide thickness (EOT) value.

High performance small field effect transistor (FET) devices are in need of precise threshold voltage control. As operating voltage decreases, threshold voltages also have to decrease, and threshold variation becomes less tolerable. Every new element, such as a different gate dielectric, or a different gate material, influences the threshold voltage. Techniques exist to tune device thresholds through the modification of the gate work function.

SUMMARY

In accordance with an embodiment, a method is provided for tuning work functions of transistors. The method includes forming a work function stack over a high-k gate dielectric grown on a semiconductor substrate, depositing a germanium oxide layer and a barrier layer over the work function stack, and annealing the germanium oxide layer to desorb oxygen therefrom to trigger oxidation of at least one conducting layer of the work function stack.

In accordance with another embodiment, a semiconductor device is provided for tuning work functions of transistors. The semiconductor device includes a work function stack formed over a high-k gate dielectric grown on a semiconductor substrate and a germanium oxide layer and a barrier layer deposited over the work function stack. The germanium oxide layer is annealed to desorb oxygen therefrom to trigger oxidation of at least one conducting layer of the work function stack.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 3:
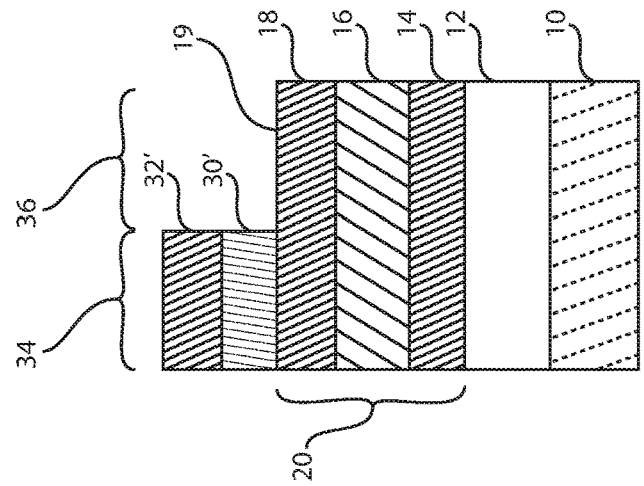
FIG. 3 is a cross-sectional view of the semiconductor structure of FIG. 2 where the germanium oxide/titanium nitride (GeOx/TiN) cap is patterned and etched, in accordance with an embodiment of the present invention.

Embodiments in accordance with the present invention provide methods and devices for achieving multiple work functions on a single structure. Multiple work function gate stacks can be useful to achieve multiple threshold voltages on fully depleted channel architectures. A variety of different work-function setting metal stacks can be used. In one example, an aluminum based work function setting metal stack is used. A GeOx/TiN cap can then be deposited over the aluminum based work function setting metal stack. However, one skilled in the art may contemplate a number of different materials to be used to form the cap.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, Ge is used in combination with TiN. However, other combinations of materials can be readily contemplated.

Embodiments in accordance with the present invention provide methods and devices for a GeOx/TiN cap that can be deposited by atomic layer deposition (ALD) and patterned on an aluminum (Al)-based work function setting metal (e.g., titanium nitride/titanium aluminum carbon/titanium nitride (TiN/TiAlC/TiN) stack). A low temperature anneal (about 500° C. or lower) can be performed to cause germanium monoxide (GeO) desorption. This process enables oxidation of the Al-based electrode in selected areas, which increases the effective work function in those areas. This can be applied to high nVt (n-type voltage threshold) and low pVt (p-type voltage threshold) devices, whereas GeOx/TiN is removed from regular Vt (voltage threshold) devices. After the anneal, the TiN cap with some germanium (Ge) residue is kept or remains, followed by deposition of one or more liner metals (e.g., TiN) and fill metals (e.g., tungsten (W)).

Embodiments in accordance with the present invention provide methods and devices for a low temperature method (e.g., less than about 400° C.) that can be used to achieve multiple work functions. The use of GeOx/TiN layers to selectively modify an Al-containing work function setting metal stack is thus introduced. The modification results in a trace of Ge in the final stack assembly, which is detectable.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this invention contact and via refer to the completed structure.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments Likewise, the term "embodiments" does not require that all embodiments include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
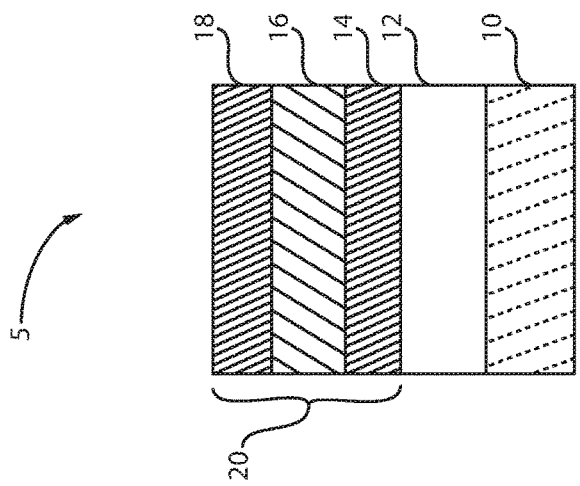
FIG. 1 is a cross-sectional view of a semiconductor structure including a work function stack having three layers, in accordance with an embodiment of the present invention.

FIG. 1 is a cross-sectional view of a semiconductor structure including a work function stack having three layers, in accordance with an embodiment of the present invention.

A semiconductor structure 5 includes a semiconductor substrate 10. An interfacial layer (IL) and high-k material layer 12 can be formed over the semiconductor substrate 10. A work function metal stack 20 can be formed over the high-k material layer 12. The work function metal stack 20 includes, e.g., three layers. A first layer 14, a second layer 16, and a third layer 18. The first layer 14 can be, e.g., a titanium nitride (TiN) layer. The second layer 16 can be, e.g., a titanium aluminum carbon (TiAlC) layer. The third layer 18 can be, e.g., another TiN layer. The work function metal stack 20 can also be referred to as an aluminum (Al)-based work function metal stack.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

In one or more embodiments, the high-k material layer 12 can have a thickness in the range of about 1 nm to about 10 nm, or in the range of about 1.5 nm to about 3 nm.

The high-k material layer 12 can be selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from about 0 to about 2.

The "work function" (WF) is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal.

WF is a material property of any material, whether the material is a conductor, semiconductor, or dielectric. For a metal, the Fermi level lies within the conduction band, indicating that the band is partly filled. For an insulator, the Fermi level lies within the band gap, indicating an empty conduction band; in the case, the minimum energy to remove an electron is about the sum of half the band gap and the electron affinity. An effective work function (eWF) is defined as the WF of metal on the dielectric side of a metal-dielectric interface.

The WF of a semiconductor material can be altered by doping the semiconductor material. For example, undoped polysilicon has a work function of about 4.65 eV, whereas polysilicon doped with boron has a work function of about 5.15 eV. When used as a gate electrode, the WF of a semiconductor or conductor directly affects the threshold voltage of the transistor.

The WF is a key parameter for setting the threshold voltage (Vth) of the complementary metal oxide semiconductor (CMOS) device, whether an n-type field effect transistor (FET) or a p-type FET. In order to obtain a good electrical control of the FET devices, the WF value should be close to the valence band of the semiconductor for a pFET and close to the conduction band of the semiconductor for an nFET, and more particularly, about 5.2 eV and about 4.0 eV, respectively for the pFET and nFET in the case of silicon.

Such WF setting metal layers can include, for example, optional layers of about 10 Å to about 30 Å thick titanium nitride and about 10 Å to about 30 Å thick tantalum nitride, followed by a non-optional about 10 Å to about 40 Å thick layer of titanium aluminum, which together make up a WF setting metal layer portion of the metal gate material stack. Alternatively, titanium aluminum nitride, titanium aluminum carbide, tantalum aluminum, tantalum aluminum nitride, tantalum aluminum carbide, hafnium silicon alloy, hafnium nitride, or tantalum carbide can be used in the WF setting metal layer portion in lieu of the titanium aluminum.

Regardless of the specific WF setting metal layers used in either an nFET or a pFET device, the remainder of the metal gate material stack can include a fill metal such as aluminum, titanium-doped aluminum, tungsten or copper to result in the metal gate material stack, as described further below in detail.

Figure 2:
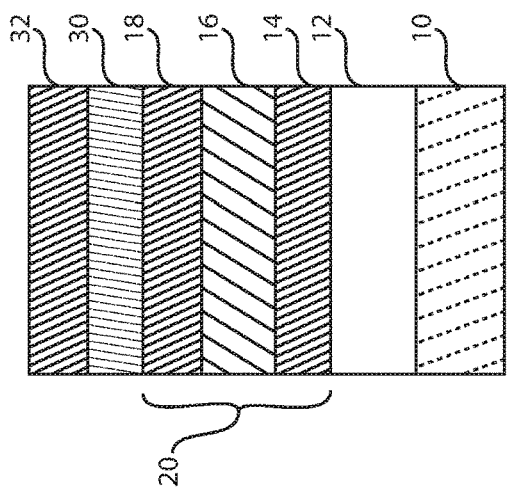
FIG. 2 is a cross-sectional view of the semiconductor structure of FIG. 1 where a germanium oxide/titanium nitride (GeOx/TiN) cap is deposited over the work function stack, in accordance with an embodiment of the present invention.

FIG. 2 is a cross-sectional view of the semiconductor structure of FIG. 1 where a germanium oxide/titanium nitride (GeOx/TiN) cap is deposited over the work function stack, in accordance with an embodiment of the present invention.

In various embodiments, a GeOx/TiN cap can be deposited over the work function metal stack 20. The cap includes a GeOx layer 30 and a TiN layer 32. The layers 30, 32 cover or extend along the entire top surface of the work function metal stack 20. The GeOx layer 30 and a TiN layer 32 can be deposited by, e.g., atomic layer deposition (ALD).

ALD is a gas phase chemical process used to create extremely thin coatings. The majority of ALD reactions use two chemicals, typically called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as ~0.1 angstroms per monolayer. ALD has unique advantages over other thin film deposition techniques, as ALD grown films are conformal, pin-hole free, and chemically bonded to the substrate. With ALD it is possible to deposit coatings perfectly uniform in thickness inside deep trenches, porous media and around particles. The film thickness range is usually 1-500 nm. ALD can be used to deposit several types of thin films, including various ceramics, from conductors to insulators.

FIG. 3 is a cross-sectional view of the semiconductor structure of FIG. 2 where the germanium oxide/titanium nitride (GeOx/TiN) cap is patterned and etched, in accordance with an embodiment of the present invention.

In various embodiments, the GeOx layer 30 and a TiN layer 32 can be patterned and selectively etched to form remaining GeOx layer 30' and a TiN layer 32'. The region 34 includes high nVt and low pVt devices, whereas the region 36 has devices that require the initial or original threshold voltage (Vt). The removal of the GeOx layer 30 and the TiN layer 32 results in the exposure of a top surface 19 of the TiN layer 18 of the work function metal stack 20. The top surface 19 is exposed in the region 36 exhibiting the original or initial Vt. The top surface is not exposed over the high nVt and low pVt devices.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 4:
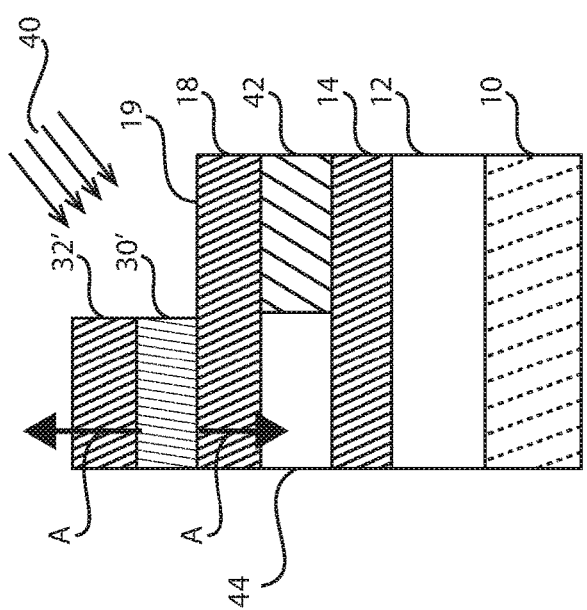
FIG. 4 is a cross-sectional view of the semiconductor structure of FIG. 3 where the germanium oxide/titanium nitride (GeOx/TiN) cap is exposed to a low temperature anneal to cause germanium monoxide (GeO) desorption, in accordance with an embodiment of the present invention.

FIG. 4 is a cross-sectional view of the semiconductor structure of FIG. 3 where the germanium oxide/titanium nitride (GeOx/TiN) cap is exposed to a low temperature anneal to cause germanium monoxide (GeO) desorption, in accordance with an embodiment of the present invention.

In various embodiments, a low temperature anneal 40 takes place causing GeO desorption. This process enables oxidation of the Al-based electrode 16 in selected areas, which increases the effective work function in those areas. The oxidation takes place in the high nVt and low pVt device region 34. The desorption of GeO is indicated by arrows "A." The desorption causes oxygen to flow into the Al-based electrode 16 from the GeOx layer 30', such that the second layer 16 of the work function metal stack 20 is modified or altered.

In particular, the left-hand side becomes a titanium aluminum carbon oxide (TiAlCO) layer 44 and the right-hand side remains a TiAlC layer 42. The TiAlCO layer 44 can be formed such that it is aligned with the remaining GeOx layer 30' and the TiN layer 32'. The TiAlC layer 42 can be formed such that it is aligned with the portion of the GeOx layer 30 and the TiN layer 32 removed in FIG. 3. Stated differently, the TiAlCO layer 44 includes the high nVt and low pVt devices, whereas the TiAlC layer 42 has regular devices that require the initial or original Vt. The TiAlCO layer 44 can be formed in the region 34, whereas the TiAlC layer 42 can be formed in the region 36.

The anneal 40 can be performed at a temperature of about 500° C. or lower. In one example embodiment, the anneal 40 occurs at a temperature of about 400° C.

Figure 5:
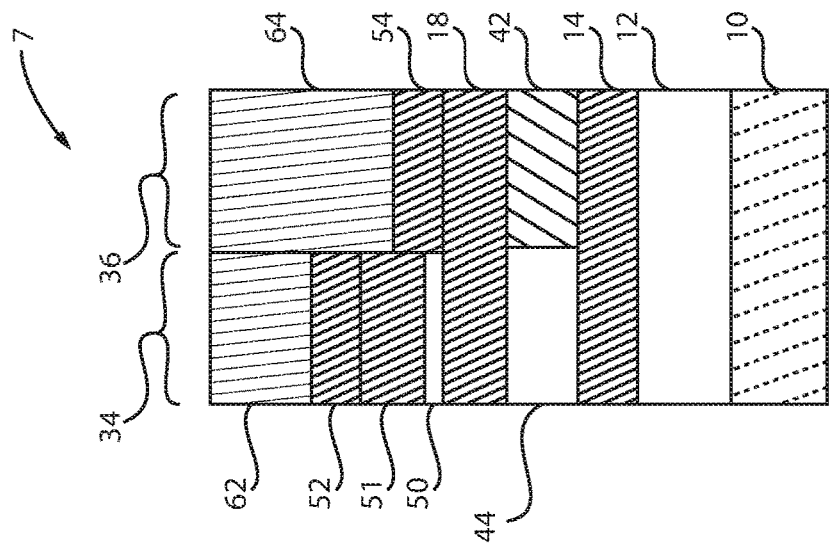
FIG. 5 is a cross-sectional view of the semiconductor structure of FIG. 4 where the TiN cap with some germanium (Ge) residue remains, followed by liner and fill metal deposition, in accordance with an embodiment of the present invention.

FIG. 5 is a cross-sectional view of the semiconductor structure of FIG. 4 where the TiN cap with some germanium (Ge) residue remains, followed by liner and fill metal deposition, in accordance with an embodiment of the present invention.

In various embodiments, after the anneal 40, in the region 34, Ge residue 50 remains. A first liner metal 51 can be deposited over the Ge residue 50. A second liner metal 52 can be deposited over the first liner metal 51. The first and second liner metals can be, e.g., TiN. A fill metal 62 can then be deposited over the first and second liner metals 50, 51. The fill metal 62 can be, e.g., tungsten (W). The Ge residue 50 is in alignment with the TiAlCO layer 44. The Ge residue 50 has a thickness that is less than the thickness of the first and second liners 51, 52. The Ge residue 50 has a thickness that is also less than the thickness of the fill metal 62. The thickness of the Ge residue 50 can be, e.g., less than 2 nm.

In various embodiments, after the anneal 40, in the region 36, a liner metal 54 can be deposited. A fill metal 64 can then be deposited over the liner metal 54. The liner metal 54 can be, e.g., TiN and the fill metal 64 can be W. The fill metal 64 can extend up to a top surface of the fill metal 62. The liner metal 54 and the fill metal 64 are aligned with the TiAlC layer 42.

As a result, the work function of selected transistors can be fine-tuned. This results in a final structure 7 having two different work functions (or a dual workfunction structure). As a result, multiple work functions can be achieved for different devices on the same wafer/chip. The work function difference is provided by selective oxidation via a GeOx layer. Stated differently, selective oxidation of certain devices on a chip can be accomplished by using the GeOx layer. Moreover, the exemplary embodiments of the present invention use a combination of GeOx/TiN layers to selectively modify an Al-containing work function setting metal stack, such that a trace of Ge remains in the final stack 7. Thus, the high nVt devices and the low pVt devices can be associated with one work function, whereas regular devices can be associated with another, different work function.

Figure 6:
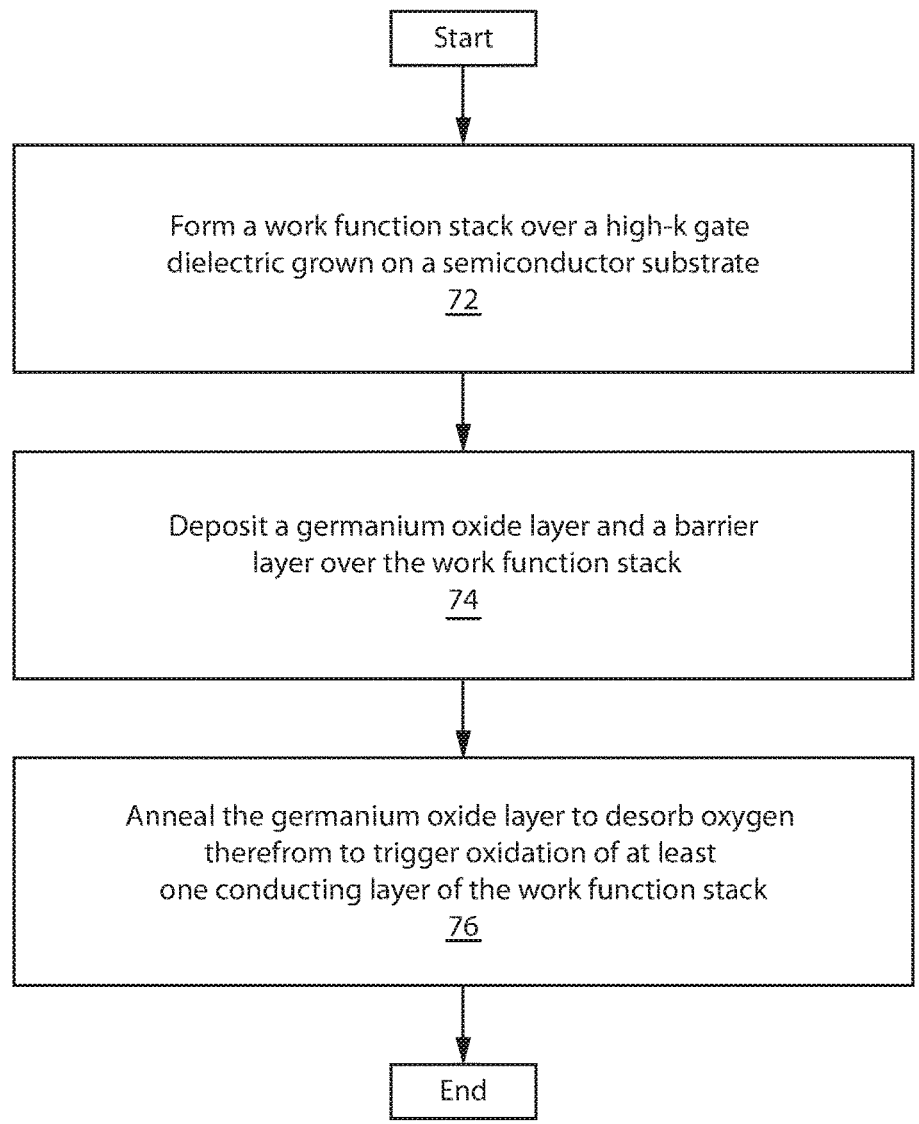
FIG. 6 is a block/flow diagram of an exemplary method for tuning work functions of transistors, in accordance with an embodiment of the present invention.

FIG. 6 is a block/flow diagram of an exemplary method for tuning work functions of transistors, in accordance with an embodiment of the present invention.

At block 72, a work function stack is formed over a high-k gate dielectric grown on a semiconductor substrate. The work function stack can include three layers. The first layer can be, e.g., a TiN layer, the second layer can be, e.g., a TiAlC layer, and the third layer can be, e.g., another TiN layer.

At block 74, a germanium oxide layer and a barrier layer can be deposited over the work function stack. The barrier layer can be another TiN layer. The germanium oxide layer and the TiN layer can extend along an entire surface of the work function metal stack. The germanium oxide layer and the TiN layer can be deposited by, e.g., ALD.

At block 76, the germanium oxide layer is annealed to desorb oxygen therefrom to trigger oxidation of at least one conducting layer of the work function stack. This step enables oxidation of the Al-based electrode in selected areas, which increases the effective work function in those areas. The oxidation takes place in the high nVt and low pVt device region.

Therefore, in summary, the gate stack has multiple work functions to achieve complementary metal oxide semiconductor (CMOS) technology with multiple threshold voltages (Vt) on fully depleted channel architectures in order to take advantage of higher mobility and smaller device variability. The exemplary embodiments of the present invention provide for a low temperature (about 400° C.) method, which requires only extremely thin additional layers (less than about 2 nm) to achieve multiple work functions.

Additionally, an Al-based work function setting metal (e.g. TiN/TiAlC/TiN) can be formed on top of a high-k layer, and after anneal, Ge residue can be formed (in the form of mixture of Ti, Ge, N, O)/TiN stack on top of the work function setting metal in the high nVt and low pVt devices only. Moreover, there is an absence of Ge residue/TiN stack in the regular Vt areas.

Furthermore, a method of fabricating a high-k metal gate structure by a replacement metal gate (RMG) process is presented where the work functions of selected transistors can be tuned by depositing, e.g., a germanium sub-oxide GeOx/TiN bilayer atop a TiN/TiAlC/TiN work function metal stack, annealing the structure at around 400° C. to desorb oxygen from the GeOx to enable oxidation of TiAlC to TiAlCO resulting in a final stack of TiN/TiAlCO/TiN/Ge/TiN with a different work function than the work function metal stacks with unoxidized TiAlC, thus enabling multiple work functions in different devices on the same wafer/chip. Moreover, CMOS device structures can be fabricated by an RMG process where one set of transistor structures comprise a work function metal stack of TiN/TiAlCO/TiN/Ge/TiN and another set of transistors comprise a work function metal stack of TiN/TiAlC/TiN so as to enable multiple work functions for different devices on the same wafer/chip.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for achieving multiple work function devices using a germanium oxide/titanium nitride (GeOx/TiN) cap on a work function setting metal (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for tuning work functions of transistors, the method comprising:
    arranging a first region over a work function (WF) stack to have a first threshold voltage;
    arranging a second region over the WF stack to have a second threshold voltage; and
    triggering oxidation of at least one conducting layer of the WF stack by desorption of germanium oxide from the first region.

2. The method of claim 1, wherein the desorption of the germanium oxide occurs by anneal.

3. The method of claim 2, wherein the anneal occurs at a temperature of less than about 400° C.

4. The method of claim 1, wherein the germanium oxide is deposited by atomic layer deposition.

5. The method of claim 1, wherein the at least one conducting layer includes aluminum (Al).

6. The method of claim 1, wherein the oxidation results in a titanium aluminum carbon oxide (TiAlCO) layer formed adjacent the WF stack.

7. The method of claim 1, wherein the first region includes high n-type threshold voltage (nVt) devices and low p-type threshold voltage (pVt) devices.

8. The method of claim 1, wherein the WF stack includes a first layer, a second layer, and a third layer.

9. The method of claim 8, wherein the first layer is a first TiN layer, the second layer is a titanium aluminum carbon (TiAlC) layer, and the third layer is a second TiN layer.

10. A method for tuning work functions of transistors, the method comprising:
arranging a first region over an aluminum-based WF stack to have a first threshold voltage by depositing a germanium oxide layer and a barrier layer thereon;
arranging a second region over the aluminum-based WF stack to have a second threshold voltage; and
triggering oxidation of at least one conducting layer of the aluminum-based WF stack by desorption of germanium oxide from the first region.

11. The method of claim 10, wherein the desorption of the germanium oxide occurs by anneal.

12. The method of claim 11, wherein the anneal occurs at a temperature of less than about 400° C.

13. The method of claim 10, wherein the germanium oxide is deposited by atomic layer deposition.

14. The method of claim 10, wherein the oxidation results in a titanium aluminum carbon oxide (TiAlCO) layer formed adjacent the aluminum-based WF stack.

15. The method of claim 10, wherein the first region includes high n-type threshold voltage (nVt) devices and low p-type threshold voltage (pVt) devices.

16. The method of claim 10, wherein the aluminum-based WF stack includes a first layer, a second layer, and a third layer.

17. The method of claim 16, wherein the first layer is a first TiN layer, the second layer is a titanium aluminum carbon (TiAlC) layer, and the third layer is a second TiN layer.

18. A structure for tuning work functions of transistors, the structure comprising:
a first region defined over a WF stack and arranged to have a first threshold voltage; and
a second region defined over the WF stack and arranged to have a second threshold voltage;
wherein oxidation of at least one conducting layer of the WF stack is triggered by desorption of germanium oxide from the first region.

19. The structure of claim 18, wherein the desorption of the germanium oxide occurs by anneal.

20. The structure of claim 18, wherein the at least one conducting layer includes aluminum (Al).

* * * * *